United States Patent [19]
Tran et al.

[11] Patent Number: 5,647,750
[45] Date of Patent: Jul. 15, 1997

[54] SOCKET FOR A TAPE CARRIER PACKAGE

[75] Inventors: Mai Loan Thi Tran, Harrisburg; Edward John Bright, Middletown; Attalee Snarr Taylor, Palmyra, all of Pa.

[73] Assignee: The Whitaker Corporation, Wilmington, Del.

[21] Appl. No.: 565,350

[22] Filed: Nov. 30, 1995

[51] Int. Cl.⁶ .................................................. H01R 9/09
[52] U.S. Cl. ........................ 439/72; 206/724; 439/526
[58] Field of Search ........................ 439/68–73, 525, 439/526; 206/728, 724

[56] References Cited

U.S. PATENT DOCUMENTS

| | | | |
|---|---|---|---|
| 4,696,526 | 9/1987 | Newton et al. | 439/68 |
| 4,744,009 | 5/1988 | Grabbe et al. | 439/72 |
| 4,767,984 | 8/1988 | Bakker | 206/724 |
| 4,937,655 | 6/1990 | Miyazaki | 257/48 |
| 4,969,828 | 11/1990 | Bright et al. | 439/68 |
| 5,009,608 | 4/1991 | Shipe | 439/73 |
| 5,046,953 | 9/1991 | Shreeve et al. | 439/66 |
| 5,109,980 | 5/1992 | Matsuoka et al. | 439/73 |

Primary Examiner—Neil Abrams
Attorney, Agent, or Firm—Robert J. Kapalka

[57] ABSTRACT

A socket is disclosed for a tape carrier package (10) having a plurality of leads (6) extending across an aperture (8) in a tape carrier (2). The socket includes a cover (14) having a tape mounting surface (44) and a plurality of ribs (30) protruding from the tape mounting surface. The ribs are arranged to extend through the aperture (8) and to straddle the leads (6) when the tape carrier package (10) is disposed on the tape mounting surface (44). The cover (14) is matable with a housing (12) holding a plurality of contacts (20). The ribs (30) straddle and guide the leads (6) into engagement with respective contacts (20) as the cover is mated with the housing. A socket for a tape carrier package (110) is also disclosed. The socket includes a cover (114) having a tape mounting surface including an undersurface (144) and an inclined surface (148). A plurality of ribs (130) which protrude from the inclined surface (148) are arranged to straddle leads (106) of the tape carrier package (110) and to guide the leads into engagement with respective contacts (120) in a housing (112). A ring member (150) mounts to the cover (114) and is securable by latches to hold the tape carrier package on the cover.

14 Claims, 8 Drawing Sheets

SOCKET FOR A TAPE CARRIER PACKAGE

FIELD OF THE INVENTION

The invention relates to an electrical socket for removably mounting an integrated circuit which is carried on flexible tape to a circuit board.

BACKGROUND OF THE INVENTION

Integrated circuit (IC) chips may be housed in a variety of electronic package styles. One style of electronic package is a tape carrier package (TCP) wherein an IC chip is mounted directly on a dielectric tape such as polyimide. A conductive foil such as copper is overlaid on the tape and is etched to produce discrete electrical leads extending from the chip. A sealing resin is applied over the chip for protection and to seal out contaminants. The TCP can be attached directly to a circuit board by a known solder process, but it is often desirable to mount the TCP in a socket which provides an electrical interconnection to the circuit board but allows the TCP to be readily removed for replacement or upgrade.

The leads from the chip on the TCP are extremely fine, i.e., on the order of 0.004 inch wide, and are spaced apart on 0.010 inch centerlines, thus making it difficult to accurately align the leads with respective contacts in a socket. There is a need for a socket which ensures accurate engagement of the leads with their respective contacts.

Further, the TCP is somewhat fragile and difficult to handle in a high volume manufacturing environment. There is a need for a TCP holder which simplifies handling of the TCP. In particular, it would be desirable for the holder to act as a subassembly of the socket, whereby the holder having the TCP therein could be secured to a socket body to form a complete socket assembly.

SUMMARY OF THE INVENTION

It is an object of the invention to provide a socket for removably connecting a tape carrier package to a circuit board.

It is another object of the invention to provide a socket subassembly which serves as a holder for a tape carrier package prior to final assembly in a socket.

The tape carrier package includes an electronic package which is mounted on a tape carrier. The tape carrier has an aperture along at least one side of the electronic package, and the electronic package has a plurality of leads extending across the aperture and arranged in a spaced-apart array.

The socket subassembly comprises a cover having a tape mounting surface configured for receiving the tape carrier in a controlled position thereagainst. A plurality of ribs protrude from the tape mounting surface. The ribs are disposed so as to extend through the aperture, and adjacent pairs of the ribs are arranged to straddle respective ones of the leads when the tape carrier is in the controlled position.

The socket includes the cover of the socket subassembly, a housing mateable with the cover, and means for fastening the cover to the housing. The housing holds a plurality of contacts corresponding to the plurality of leads. The contacts have respective trace-engaging portions which extend externally of the housing for engagement with respective circuit traces on the circuit board, and respective lead-engaging portions which extend externally of the housing for engagement with respective ones of the leads. The lead-engaging portions are disposed in an array corresponding to the array of leads, whereby when the cover is mated with the housing, the lead engaging portions are straddled and guided by the adjacent pairs of ribs as the leads are urged into engagement with their respective lead engaging portions.

BRIEF DESCRIPTION OF THE DRAWINGS

The invention will now be described by way of example with reference to the accompanying drawings in which like elements in different figures thereof are identified by the same reference numeral and wherein.

DETAILED DESCRIPTION OF THE PREFERRED EMBODIMENT

Figure 1:
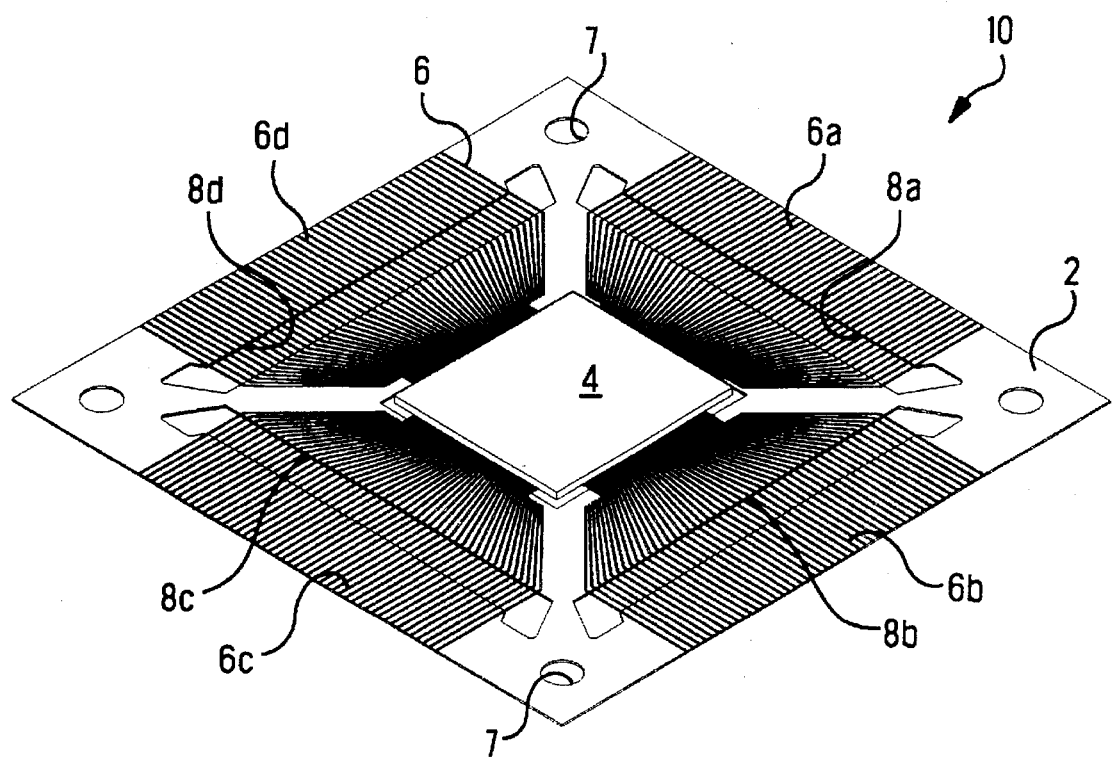
FIG. 1 is an isometric view of a tape carrier package with which the invention can be used.

There is shown in FIG. 1 a tape carrier package (TCP) 10 with which the invention can be used. The TCP, which can be fabricated by known tape automated bonding (TAB) techniques, comprises a flexible carrier tape 2 which is made from a dielectric material such as polyimide. An integrated circuit (IC) chip 4 is mounted on the tape and has leads 6 extending in groups 6a, 6b, 6c, 6d from each side of the chip and adhered to the tape for stability. In order to expose the leads 6 for connection with contacts in a socket, the tape has openings or apertures 8 which are individually identified as apertures 8a, 8b, 8c, 8d associated with respective ones of the lead groups 6a, 6b, 6c, 6d. The leads in each group extend across their associated aperture from one side thereof to the other, and are routed across their associated aperture in a spaced-apart array. Preferably, the leads in each array are parallel to each other, although the leads may be arranged in some other orientation with respect to each other. The leads are adhered to the carrier tape on both sides of their associated aperture, thus maintaining the orientation of the leads in each array.

Integrated circuit chips are commonly produced in a four-sided configuration as shown. The TCP for a four-sided chip has the four lead groups 6a, 6b, 6c, 6d and the four apertures 8a, 8b, 8c, 8d; however, the invention could be adapted for use with a TCP having a chip with more or less than four but at least one of the lead groups and associated apertures.

Figure 2:
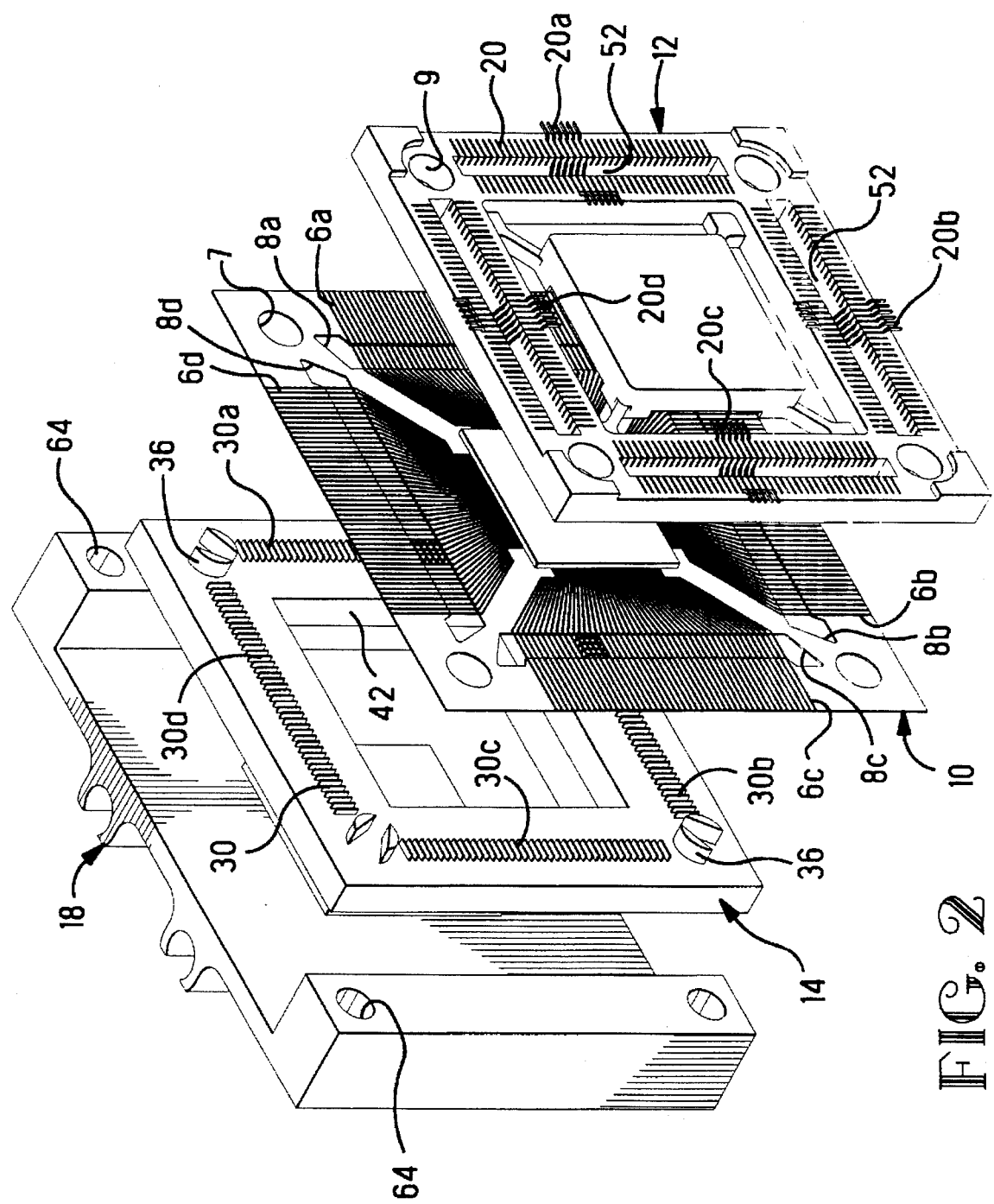
FIG. 2 is an exploded isometric view of a socket assembly according to the invention.
Figure 3:
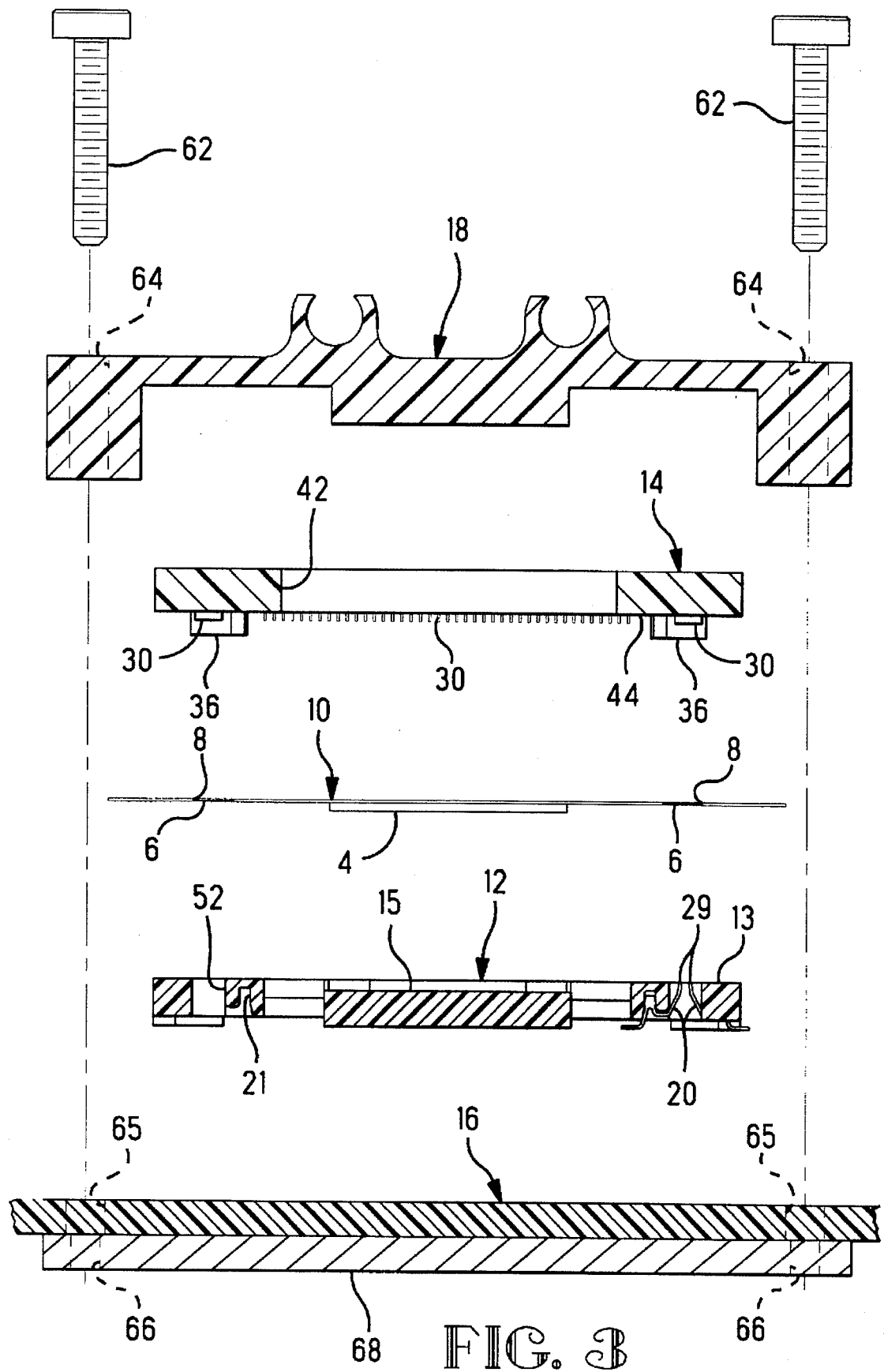
FIG. 3 is an exploded cross-sectional view of the socket assembly.

With reference to FIGS. 2 and 3, a socket for the TCP 10 includes a mateable housing 12 and cover 14 which sandwich the TCP 10 therebetween. The housing 12 holds a plurality of contacts 20 which electrically connect the leads 6 of the TCP 10 to respective circuit traces on a circuit board 16. The cover 14 has a plurality of ribs 30 which are arranged to enter the apertures 8 of the TCP and become interleaved between the leads 6 when the TCP is applied to the cover 14, as will be more fully explained hereinafter. The socket preferably has a heat sink 18 which resides on the cover in thermal communication with the IC chip 4 of the TCP. The IC chip 4 is supported on surface 15 of a central portion of the housing when the heat sink is applied. The housing, cover and heat sink are secured to the circuit board 16 by a suitable fastening means, for example, threaded fasteners 62 which are slip fit through holes 64 in the heat sink and holes 65 in the circuit board and engage in complementary threaded holes 66 in a bolster board 68, or other fastening means such as a spring clip, a latch, etc.

The cover 14 is a dielectric member having a central opening 42. A substantially planar underside of the cover serves as a tape mounting surface 44 against which the TCP can be lodged in a controlled position. Protruding from the tape mounting surface 44 are the plurality of ribs 30 which are arranged in groups 30a, 30b, 30c, 30d in a quadrilateral configuration corresponding to the groups of leads 6a, 6b, 6c, 6d of the TCP. In the preferred embodiment shown, the ribs in each of the groups 30a, 30b, 30c, 30d are arrayed parallel to each other in side-by-side spaced apart relationship. The ribs 30 are arranged such that the TCP can be lodged against the tape mounting surface 44 with the groups of ribs 30a, 30b, 30c, 30d received in the respective apertures 8a, 8b, 8c, 8d; the ribs and apertures thereby provide a first means for controlling the position of the TCP on the mounting surface 44. A second means for controlling the position of the TCP on the mounting surface may be provided by alignment pins 36 which are receivable in end portions of the apertures 8a, 8b, 8c, 8d. Alignment holes 9 in the housing 12 may be sized to receive the pins 36 with a slight interference fit, thereby providing a means for securing the cover to the housing.

The ribs 30 in each of the groups 30a, 30b, 30c, 30d are arrayed in correspondence with the leads 6 such that when the TCP is applied to the tape mounting surface 44 of the cover, each of the leads will be straddled by a pair of adjacent ribs and will be guided by the ribs until becoming disposed against the tape mounting surface 44 at the base of the ribs. The ribs thereby serve to maintain alignment of the leads in their intended array across their associated aperture 8. Further, the ribs may serve to secure the TCP to the cover. The TCP is of such light weight that it is frictionally retained to the mounting surface of the cover even when the TCP is on an underside of the cover, whereby the cover may be used as a subassembly for storing, handling and transporting the TCP prior to final assembly to the socket.

The contacts 20 in the housing 12 are arranged in groups 20a, 20b, 20c, 20d corresponding to the groups of exposed leads 6a, 6b, 6c, 6d of the TCP. For clarity, only a portion of the contacts in each group are shown in FIG. 2. The housing has a number of wells 52 corresponding to the number of groups of contacts, and the contacts in each group extend through their associated well and are arranged to engage respective ones of the leads when the cover having the TCP thereon is mated with the housing.

Figure 4:
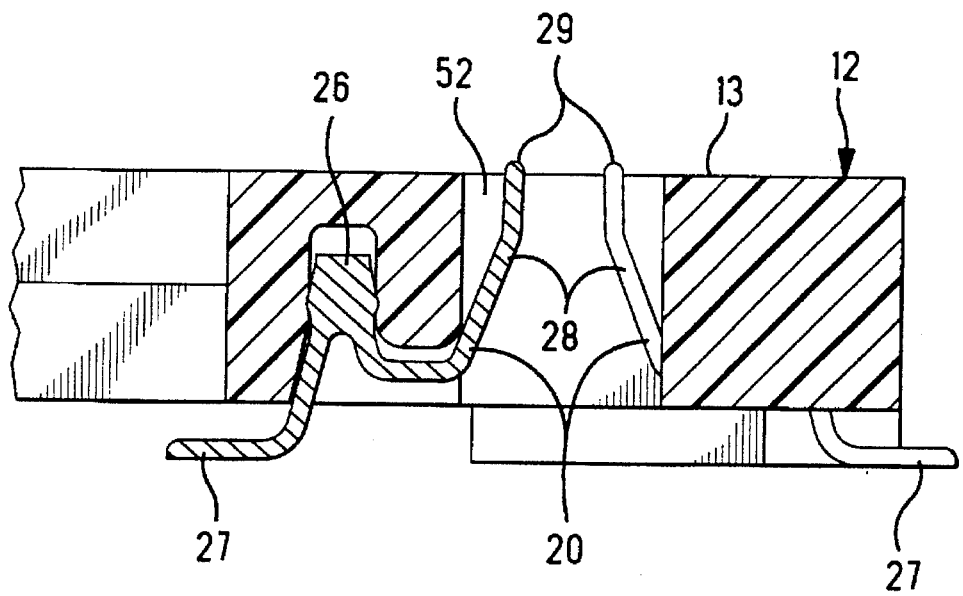
FIG. 4 is an enlarged cross-sectional view through a portion of a housing of the socket assembly.

As shown in detail in FIG. 4, each of the contacts 20 has a retention portion 26 which is engageable in a respective aperture in the housing 12 to secure the contact therein. Each of the contacts further has a surface mount foot or other trace-engaging portion 27 for engaging a corresponding circuit trace on a circuit board, and a lead-engaging portion 28 for engaging a respective one of the exposed leads 6. The contacts in each group have their retention portions 26 staggered in alternating sequence on opposite sides of their well 52 for increased separation between the trace-engaging portions 27. Each of the lead engaging portions 28 extends through its associated well 52 and has a tip 29 which normally resides slightly above upper surface 13 of the housing 12.

Figure 5:
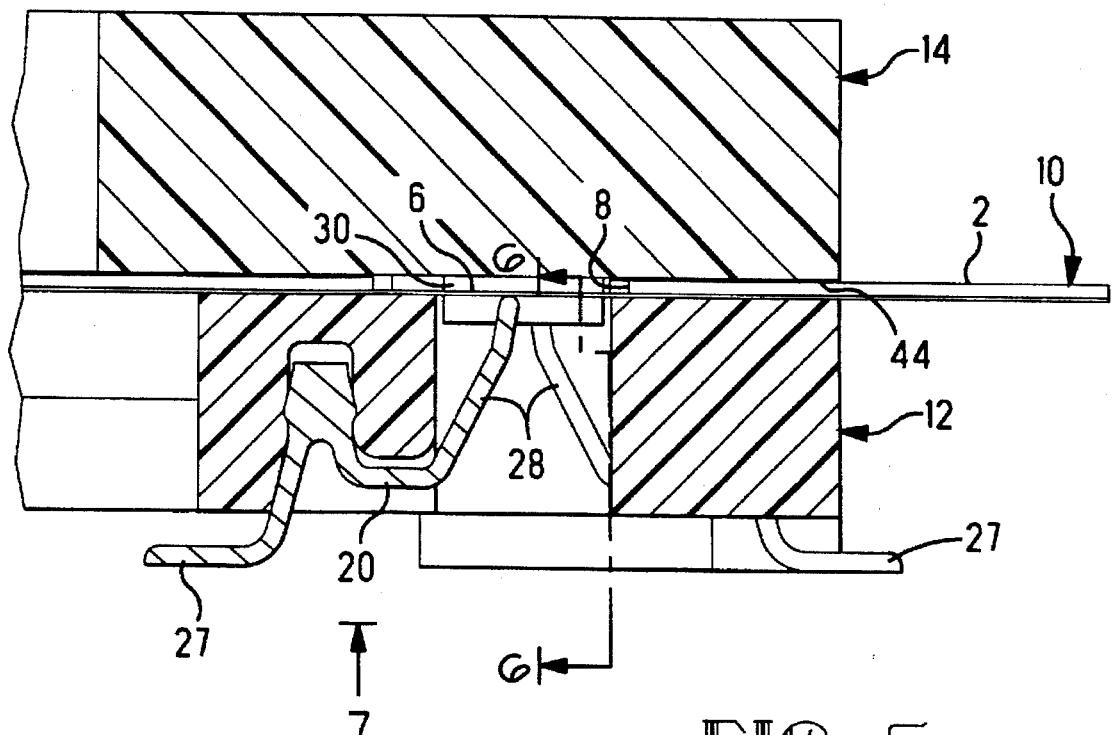
FIG. 5 is an enlarged cross-sectional view through a portion of the socket assembly.
Figure 6:
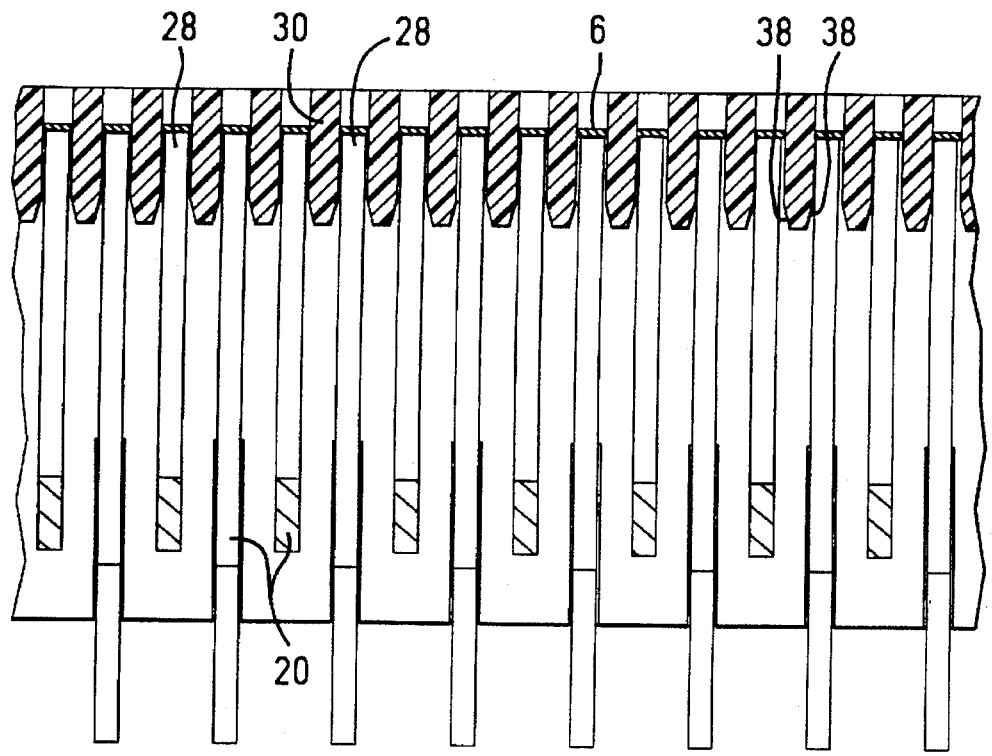
FIG. 6 is a view taken along line 6—6 in FIG. 5.
Figure 7:
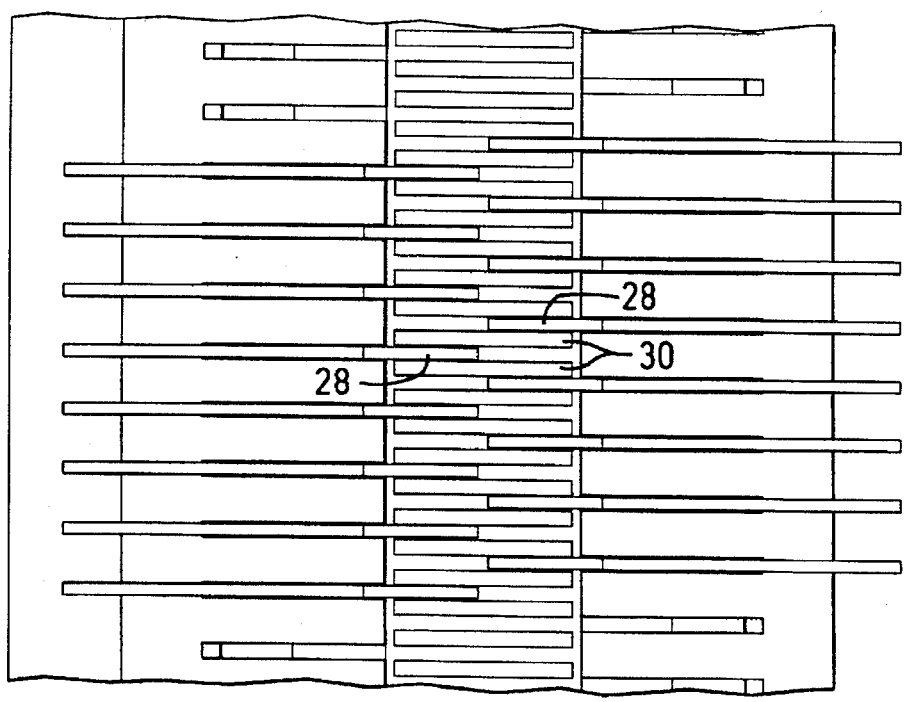
FIG. 7 is a view in the direction of arrow 7 in FIG. 5.
Figure 8:
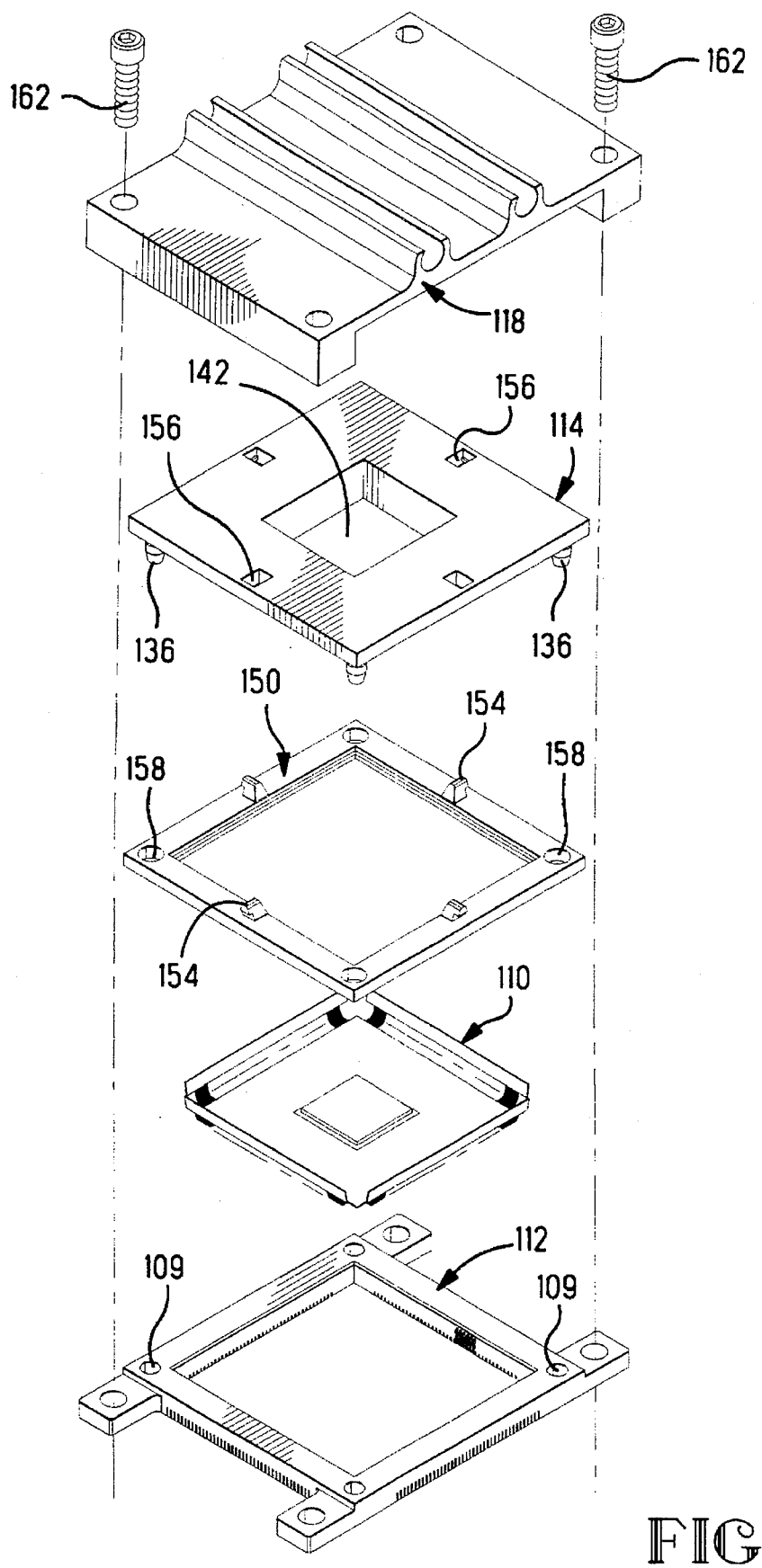
FIG. 8 is an exploded isometric view of an alternate embodiment of the socket assembly.
Figure 9:
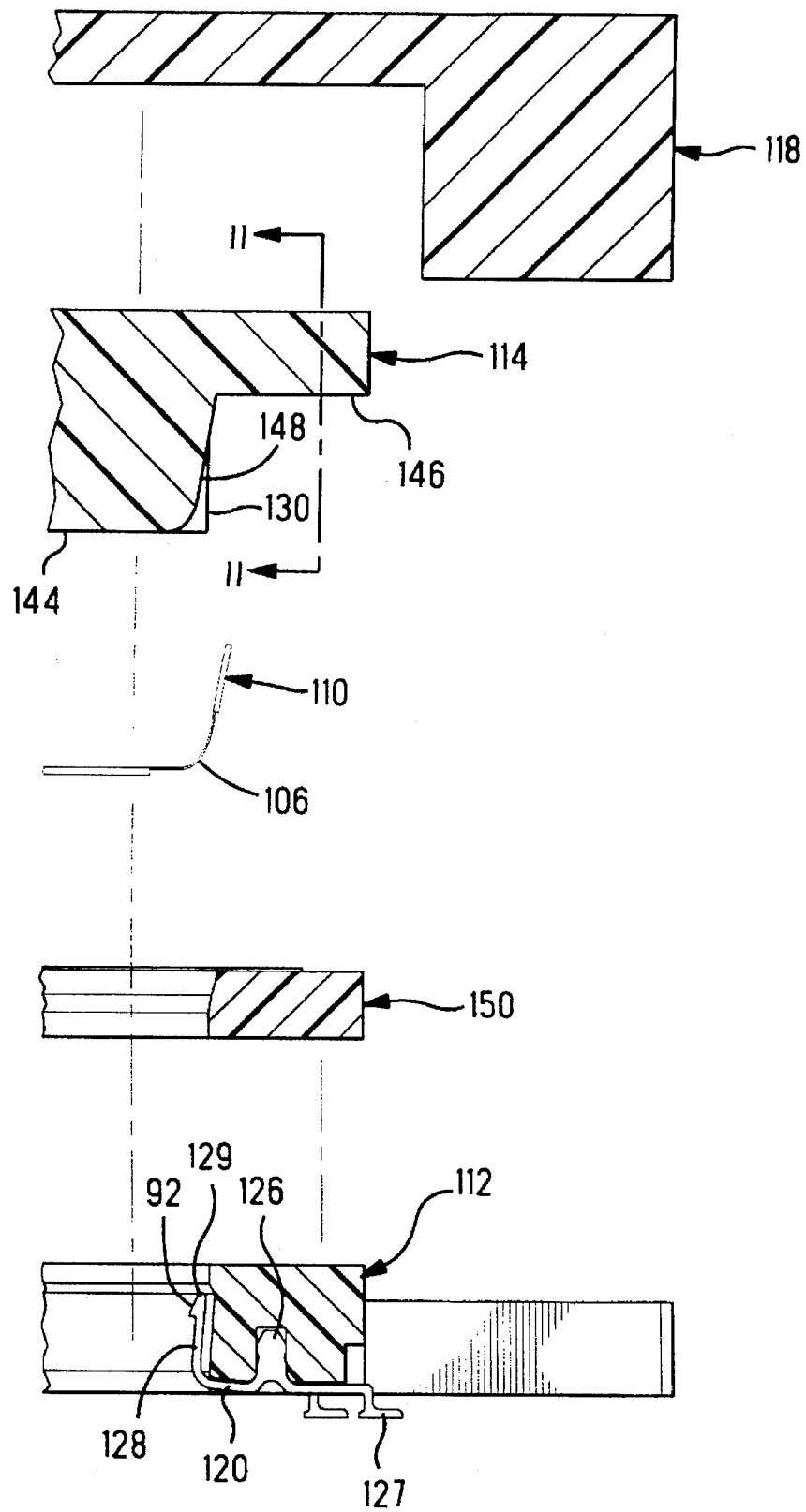
FIG. 9 is an exploded cross-sectional view through a portion of the socket assembly of FIG. 8.
Figure 10:
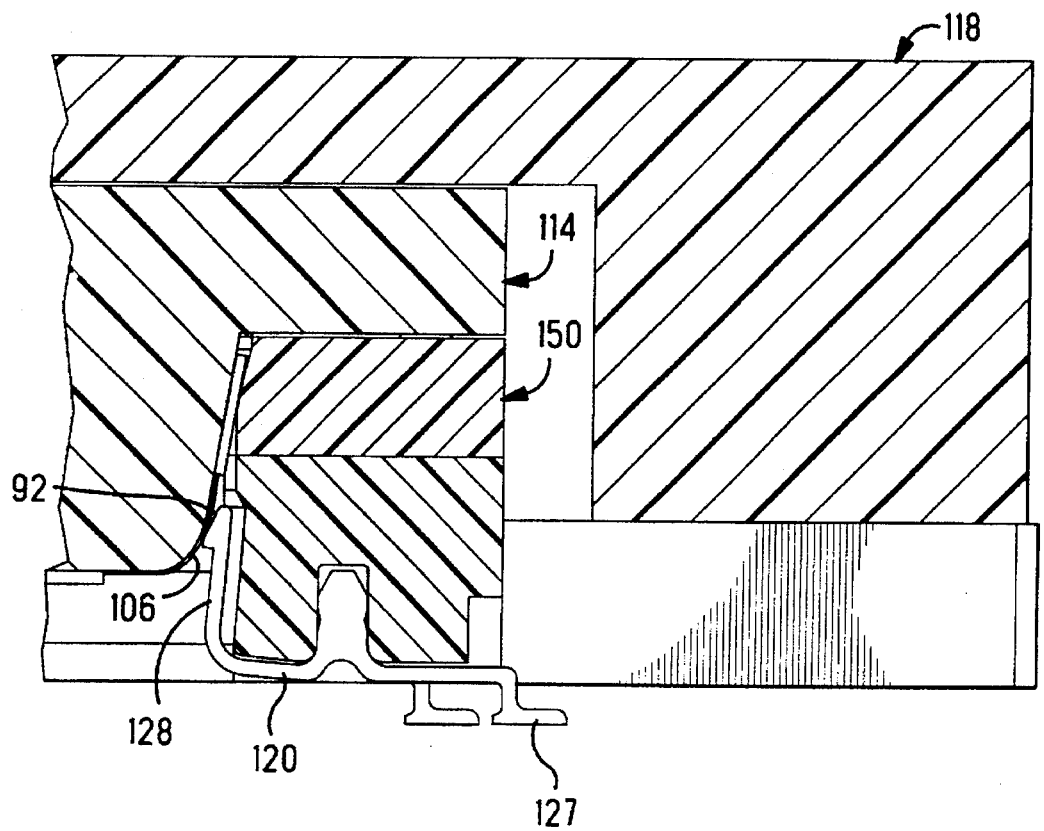
FIG. 10 is a cross-sectional view showing the components of FIG. 9 in assembled relationship.
Figure 11:
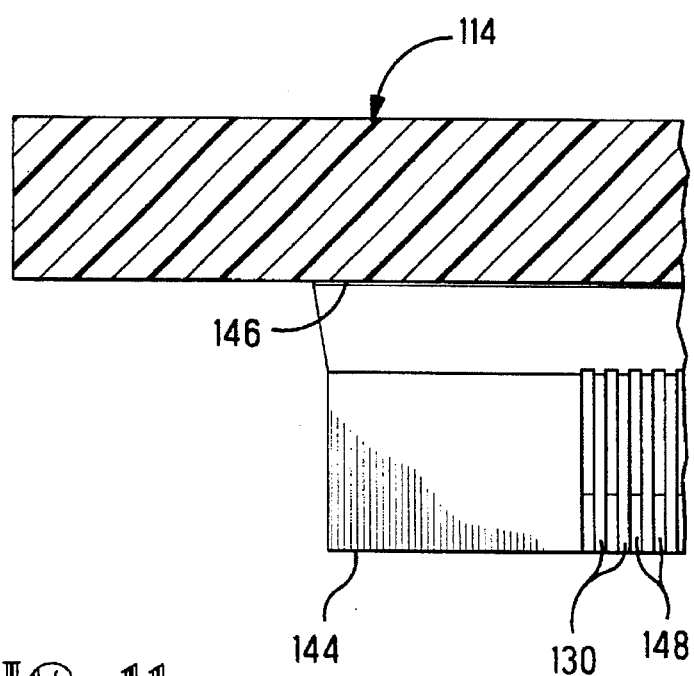
FIG. 11 is a cross-sectional view taken along line 11—11 of FIG. 9.

With reference to FIGS. 5, 6 and 7, when the cover 14 having the TCP 10 thereon is placed upon the housing, the ribs 30 become interleaved between the lead-engaging portions 28 of the contacts. The ribs preferably have leading ends with beveled edges 38 in order to facilitate entry of the ribs between the lead-engaging portions. The beveled edges on an adjacent pair of ribs serve to guide a respective lead-engaging portion 28 into a space between the pair of ribs. Thus, the ribs serve to comb and guide the lead-engaging portions into alignment with the exposed contacts which are straddled by the ribs. As the cover is mated with the housing, the leads 6 engage and resiliently deflect the respective lead-engaging portions 28 of the contacts, thereby generating a normal force on the engaged surfaces of the leads and the contacts. Due to the resiliency of the lead-engaging portions 28, some force is required to maintain the cover and housing in the fully mated condition, and this force is supplied by the previously described fastening means such as threaded fasteners 62.

The foregoing embodiment may be termed a vertical deflection socket due to the fact that, considering the circuit board to be horizontal, normal forces between the contacts 20 and the leads 6 are exerted in a vertical direction. Each of the contacts must be deflected by a force of approximately seventy-five grams in order to assemble the socket and, for a socket with many contacts, the total deflection force becomes quite large. For example, a socket having 320 contacts requires a total deflection force of approximately fifty-three pounds which must be applied in the vertical direction to deflect the contacts and mate the cover to the housing.

An alternate embodiment which may be termed a horizontal deflection socket reduces the force that must be applied to mate the cover to the housing. Such a socket is shown in FIGS. 8, 9, 10 and 11 to include a housing 112, a cover 114, a ring member 150, and a heat sink 118 which accommodate a TCP 110. The cover 114 is a dielectric frame member having a central opening 142 and a horizontal undersurface 144. The cover has an undercut 146 along its outer perimeter, thereby forming an inclined surface 148 which is connected to the undersurface 144. The surfaces 144 and 148 serve as a tape mounting surface for the TCP. The inclined surface 148 is preferably canted from vertical at an angle of about five or ten degrees. Ribs 130 protrude from the inclined surface 148 in a horizontal direction. The TCP is lodged against the tape mounting surface in a controlled position which is governed by the ribs 130, and may also be governed by some other alignment feature of the cover entering a corresponding aperture in the TCP.

The ring member 150 mounts to the cover in the region beneath the undercut 146 and is securable to the cover by latches 154 which are insertable through apertures 156 in the cover. Alignment pins 136 of the cover are receivable in holes 158 in the ring member and in holes 109 in the housing.

The housing 112 holds contacts 120 which have a retention portion 126, a trace-engaging portion 127, and a lead-engaging portion 128. The trace-engaging portions 127 are arranged in two linear rows and are staggered alternately in opposite ones of the rows for greater separation. The lead-engaging portions 128 extend upwardly to free ends 129 each having an engagement edge 92 which is beveled on an angle approximating the angle of the inclined surface 148.

Figure 12:
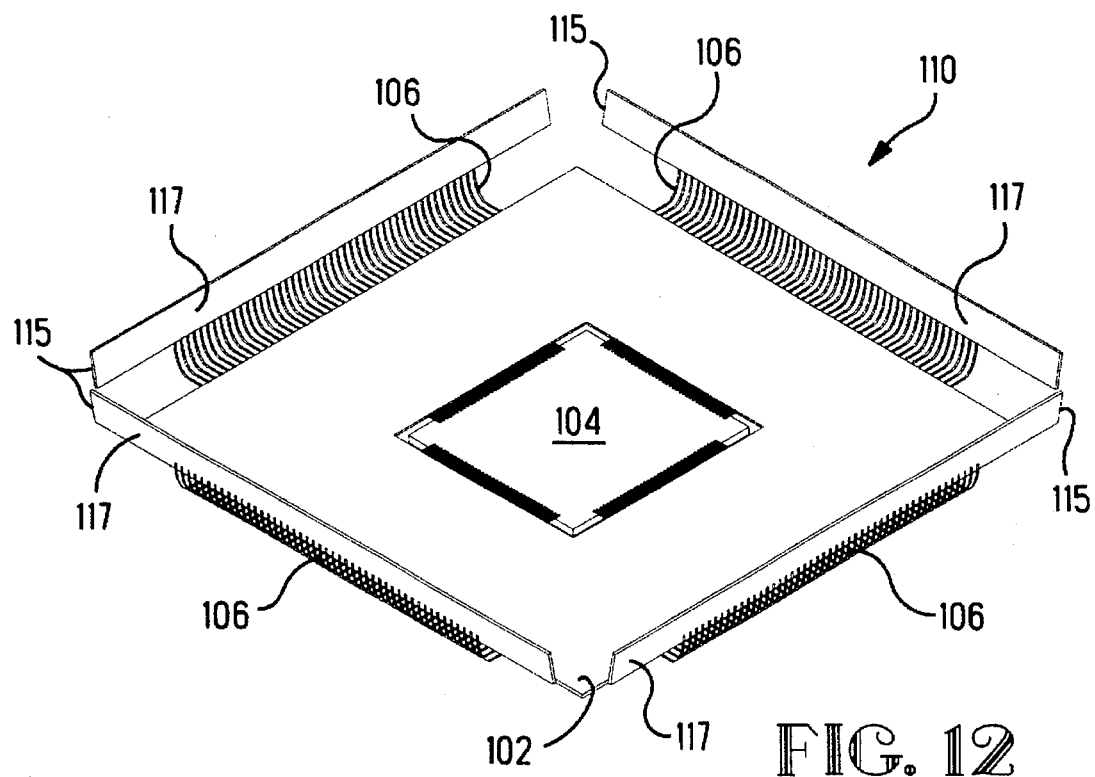
FIG. 12 is an isometric view of a tape carrier package with which the alternate embodiment of the socket can be used.

A TCP 110 which can be mounted in the horizontal deflection socket is shown in FIG. 12. Similar to the TCP 10 which is accommodated by the vertical deflection socket, the TCP 110 comprises a carrier tape 102, an IC chip 104, and leads 106. The TCP 110 has cutouts 115 at the corners thereof which enable peripheral portions 117 of the TCP to be bent out of the plane of the TCP without distorting the carrier tape.

The TCP may be lodged against the tape mounting surfaces 144 and 148 of the cover 114 with the leads 106 of the TCP interleaved between the ribs 130. In order to hold the TCP to the cover, the ring member 150 is secured to the cover by the latches 154, with the peripheral portions 117 of the TCP sandwiched therebetween. The cover and ring member thus provide a subassembly which serves as a holder for handling and storage of the TCP. When the subassembly is applied to the housing 112, the ribs 130 straddle and guide the free ends 129 of the contacts into engagement with the leads 106. The subassembly must be applied to the housing with a downward force in order to resiliently deflect the lead-engaging portions 128. The inclined surface 148 of the cover supports the leads 106 and provides a wedging action against the engagement edges 92 of the contacts, thereby substantially reducing the downward force which must be applied in order to resiliently deflect the lead-engaging portions 128. The cover and ring subassembly may be fastened between the housing and the heat sink by fastening means such as threaded fasteners 162.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

We claim:

1. A socket for electrically connecting an electronic package which is mounted on a tape carrier to a circuit board, the tape carrier having an aperture along at least one side of the electronic package, and the electronic package having a plurality of leads extending across the aperture and arranged in a spaced-apart array, the socket comprising:

a cover having a tape mounting surface configured for receiving the tape carrier in a controlled position thereagainst, and a plurality of ribs protruding from the tape mounting surface, the ribs being disposed so as to extend through the aperture and being arranged in an array such that adjacent pairs of the ribs straddle respective ones of the leads when the tape carrier is in the controlled position;

a housing mateable with the cover, the housing holding a plurality of contacts corresponding to the plurality of leads, the contacts having respective trace-engaging portions which extend externally of the housing for engagement with respective circuit traces on the circuit board, the contacts having respective lead-engaging portions which extend externally of the housing for engagement with respective ones of the leads, the lead-engaging portions being disposed in an array corresponding to the array of leads for engagement therewith when the cover having the tape carrier in the controlled position is mated with the housing; and, means for fastening the cover to the housing;

whereby when the cover is mated with the housing, the lead engaging portions are straddled and guided by the adjacent pairs of ribs as the leads are urged into engagement with their respective said lead engaging portions.

2. The socket according to claim 1, wherein the cover has alignment pins disposed for registration with holes in the tape carrier to establish the controlled position.

3. The socket according to claim 1, wherein the ribs in the array are parallel to each other in side-by-side spaced apart relationship.

4. The socket according to claim 1, wherein the ribs are arranged in four groups disposed in a quadrilateral configuration.

5. The socket according to claim 4, wherein the ribs in each of the groups are arrayed parallel to each other in side-by-side spaced apart relationship.

6. The socket according to claim 1, wherein leading ends of the ribs have beveled edges.

7. The socket according to claim 1, wherein the tape mounting surface is substantially planar.

8. The socket according to claim 1, wherein the tape mounting surface includes an undersurface disposed in a first plane and an inclined surface connected to the undersurface, and the ribs extend from the inclined surface.

9. The socket according to claim 8, further comprising a pressure ring attachable to the cover, the pressure ring and the cover being cooperable to sandwich a portion of the tape carrier therebetween, thereby assisting in retaining the tape carrier to the cover.

10. The socket according to claim 1, wherein the housing has a central portion with a surface disposed for supporting the electronic package thereon.

11. A socket subassembly for handling an electronic package which is mounted on a tape carrier during a time interval prior to final assembly to a socket, the tape carrier having an aperture along at least one side of the electronic package, and the electronic package having a plurality of leads extending across the aperture and arranged in a spaced-apart array, the subassembly comprising:

a cover having a tape mounting surface configured for receiving the tape carrier in a controlled position thereagainst, and a plurality of ribs protruding from the surface, the ribs being disposed so as to extend through the aperture and being arranged in an array such that adjacent pairs of the ribs straddle and frictionally retain respective ones of the leads when the tape carrier is in the controlled position, wherein the tape carrier is retained to the cover for handling.

12. The socket subassembly according to claim 11, wherein the tape mounting surface is substantially planar.

13. The socket subassembly according to claim 11, wherein the tape mounting surface includes an undersurface disposed in a first plane and an inclined surface connected to the undersurface, and the ribs extend from the inclined surface.

14. The socket subassembly according to claim 13, further comprising a pressure ring attachable to the cover, the pressure ring and the cover being cooperable to sandwich a portion of the tape carrier therebetween, thereby assisting in retaining the tape carrier to the cover.

* * * * *